United States Patent [19]

Chen et al.

[11] Patent Number: 5,691,537

[45] Date of Patent: Nov. 25, 1997

[54] METHOD AND APPARATUS FOR ION BEAM TRANSPORT

[76] Inventors: John Chen, 38 Cornell Rd., Beverly, Mass. 01915; Victor Benveniste, 8 Harbor Heights, Gloucester, Mass. 01930; Thomas N. Horsky, 816 Depot Rd., Boxborough, Mass. 01719; William E. Reynolds, 210 Perkins Row, Topsfield, Mass. 01983

[21] Appl. No.: 589,303

[22] Filed: Jan. 22, 1996

[51] Int. Cl.⁶ .................. H01J 37/30; H01S 1/00
[52] U.S. Cl. .................. 250/251; 250/492.21
[58] Field of Search ............... 250/251, 492.21, 250/398

[56] References Cited

U.S. PATENT DOCUMENTS

| | | | |
|---|---|---|---|
| 4,101,765 | 7/1978 | Hooper | 250/251 |
| 4,804,837 | 2/1989 | Farley | 250/251 |
| 4,825,087 | 4/1989 | Renau et al. | 250/492.2 |
| 4,904,902 | 2/1990 | Tamai et al. | 250/492.2 |
| 4,914,292 | 4/1990 | Tamai et al. | 250/492.2 |
| 4,916,311 | 4/1990 | Fuzishita et al. | 250/492.2 |
| 4,994,674 | 2/1991 | Tamai et al. | 250/492.2 |
| 5,089,710 | 2/1992 | Kikuchi et al. | 250/492.3 |
| 5,126,576 | 6/1992 | Wauk et al. | 250/492.3 |
| 5,136,171 | 8/1992 | Leung et al. | 250/492.3 |
| 5,148,034 | 9/1992 | Koike | 250/251 |
| 5,164,599 | 11/1992 | Benveniste | 250/251 |
| 5,343,047 | 8/1994 | Ono et al. | 250/251 |
| 5,350,926 | 9/1994 | White et al. | 250/251 |
| 5,399,871 | 3/1995 | Ito et al. | 250/492.21 |
| 5,554,854 | 9/1996 | Blake | 250/492.21 |

OTHER PUBLICATIONS

"Magnet Optics for Beam Transport", HF Glavish, Nuclear Instruments and Methods 189 (1981) pp. 43–53.
"Optics of Charged Particles", Wolinik, Academic Press, Inc. 1987, pp. 4, 118, 119, 280–285.

*Primary Examiner*—Bruce Anderson
*Attorney, Agent, or Firm*—Watts, Hoffman, Fisher & Heinke Co., LPA

[57] ABSTRACT

Method and apparatus for maintaining an ion beam along a beam path from an ion source to an ion implantation station where workpieces are treated with the ion beam. A beam neutralizer is positioned upstream from the beam implantation station and injects neutralizing electrons into the ion beam. A magnetic field is created upstream from the position of the beam neutralizer for inhibiting upstream movement of neutralizing electrons. A disclosed technique for setting up the magnetic field for inhibiting electron movement is with spaced apart first and second permanent magnets.

15 Claims, 5 Drawing Sheets

METHOD AND APPARATUS FOR ION BEAM TRANSPORT

FIELD OF INVENTION

The present invention concerns a method and an apparatus for improving ion beam transmission in an ion implanter while maintaining ion implantation dose uniformity within acceptable limits across the surface of an implanted target.

BACKGROUND OF THE INVENTION

In a high current ion implanter, the ion beam propagates from the ion source to the work piece through a beam plasma. In such a plasma, the positive space charge produced by the ions is compensated by negative space charge produced by electrons orbiting through and around the ion beam. These electrons are quasi-stationary and do not move along the direction of the ion beam propagation.

If these electrons are removed from the beam space, the uncompensated space charge produced by the ions will generate electric fields in a direction radial to the beam center. Under the effect of such fields, the ions will be deflected away from the beam center, causing the beam to diverge and increase in cross-section, until it no longer fits within the available physical envelope. This occurrence is generally referred to as "beam blow-up".

The beam target or work piece is often an electrically insulating silicon wafer from which a CMOS integrated circuit is fabricated. As the positively charged ion beam strikes the silicon wafer, the wafer acquires a net positive charge. Acquiring this charge will create an electric field in the region of the wafer which will attract neutralizing electrons from the beam plasma resulting in beam blow-up.

A second result of positive charging of the CMOS integrated circuits is possible damage to the circuit. As a net positive charge builds on the circuit, large electric fields develop at the surface of the wafer which can damage the junctions and gates of the device as they are being created.

To prevent the damage caused by an ion beam that has a net positive charge prior art implanters have utilized an "electron shower" or "electron flood." Such a device is located just up-stream from the target and provides an electron current equal to the positive ion beam current so that the resulting ion beam has zero net charge.

While electron showers for ion implanters have been used with some success in prior art implanters their use does have some drawbacks. The electron showers may not provide sufficient electron current to completely neutralize the ion current. When this occurs the beam will partially blow-up and may cause unacceptable implant dose non-uniformity. Experience with prior art implanters suggest that even though the beam is not totally neutralized, if the length of beam blow up can be limited the adverse effects on beam uniformity are lessened.

In order to limit the effects of partial blow-up caused by a non-neutralized beam, a "bias aperture" is generally located upstream (in the direction of the ion source) from the electron shower. This aperture is a negatively charged metallic ring that surrounds the beam. This aperture causes a negative potential in the center of the beam that prevents electrons from either side (upstream or downstream) from propagating through the ring. This phenomena is illustrated in FIG. 2 which illustrates a representative prior art electron suppression ring placed upstream from an electron shower.

In the FIG. 2 depiction the ring R is located between two grounded conductive members C1, C2. The ring R is maintained at an electric potential of 2.5 kilovolts below ground and hence deflects electrons away from the plane of the ring R as seen by the movement of electrons in FIG. 2.

Unfortunately, the same electric field that prevent electrons from propagating through the biased ring R also depletes electrons within a distance of about one ring diameter of the bias ring R. Within this distance of the ring R, the positive ion space charge is totally uncompensated and beam blow-up will occur. The problems caused by this beam blow-up are more pronounced for low energy ion implantation beams.

DISCLOSURE OF THE INVENTION

Practice of the present invention impedes backstreaming of neutralizing electrons, but unlike use of a negatively biased electrode does not deplete a region of the ion beam of all electrons.

In accordance with practice of the invention a beam of ions is directed along a beam travel path from a source to an implantation station where target workpieces are placed for ion beam treatment. Neutralizing electrons are injected into the ion beam at a neutralizing location before the ion beam contacts the target workpieces. A magnetic field is created upstream from the neutralizing location to inhibit backstreaming of neutralizing electrons.

The creation of the magnetic field is most preferably accomplished by positioning permanent magnets on opposite sides of the ion beam at a location just before the beam reaches the beam neutralizer. The magnets set up a magnetic field in the region through which the ion beam passes. This magnetic field causes electrons to move back and forth along spiraling paths, but does not repulse them away from their positions within the ion beam. Electrons that move away from the region of the beam neutralizer back up the ion beam, however, are repulsed by the magnetic field created by the permanent magnet.

Electron loss in the region of the magnet is further inhibited by providing a magnetic field where highly concentrated magnetic field lines are outside the region of the ion beam space.

These and other objects, advantages and features of the invention will become better understood from a detailed description of a preferred embodiment of the invention which is described in conjunction with the accompanying drawings.

DETAILED DESCRIPTION

Figure 1:
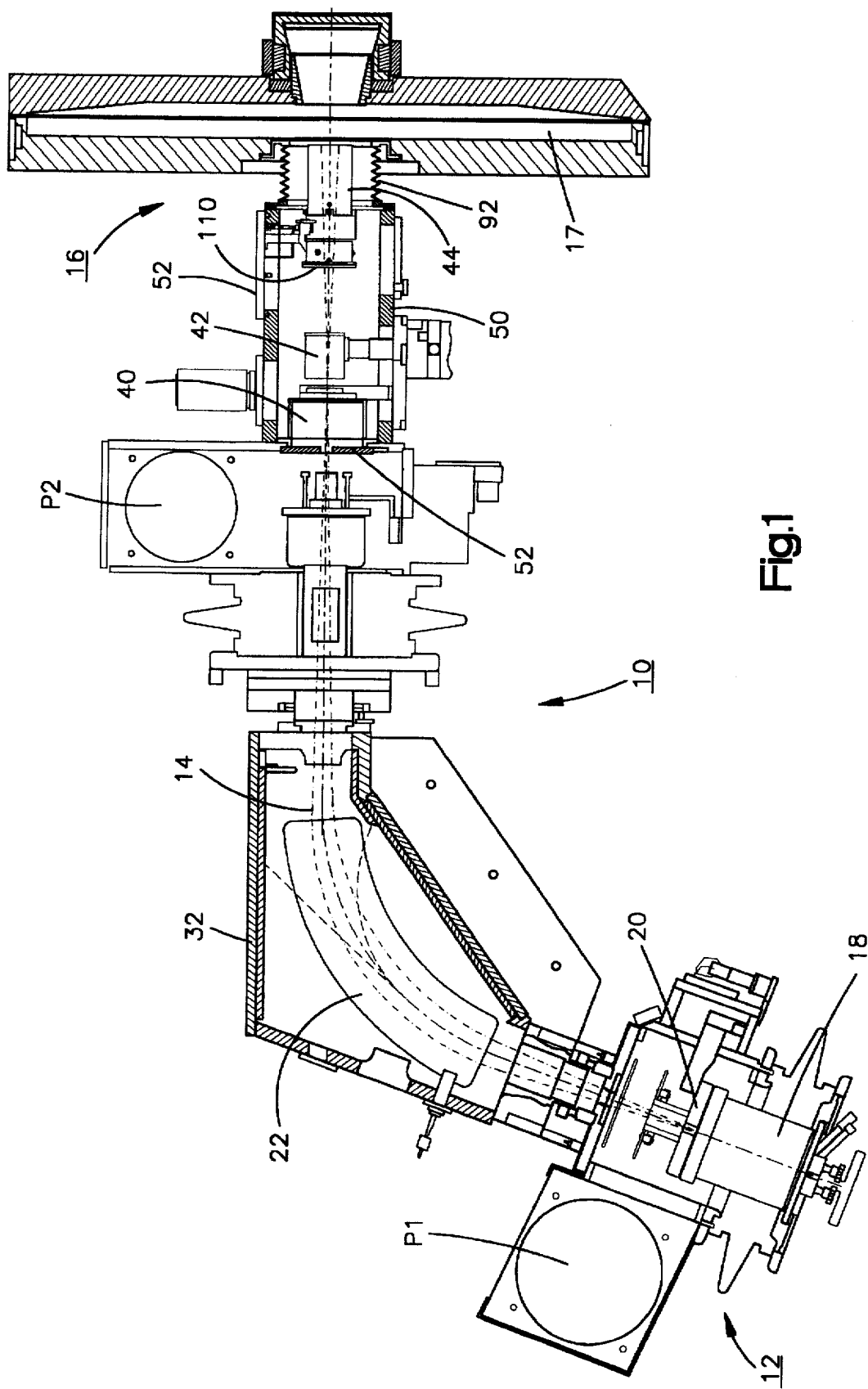
FIG. 1 is a top view, partly in section, showing an ion implanter including an ion source, beam forming and shaping structure and an implantation chamber.

Turning now to the drawings, FIG. 1 depicts an ion implanter, shown generally at 10, which includes an ion source 12 for emitting ions that form an ion beam 14 that traverses a beam path to an implantation station 16. Control electronics (not shown) monitor and control the ion dosage received by the wafers within a process chamber 17 at the implantation station 16.

The ion source 12 includes a plasma chamber 18 into which source materials are injected for ionization. The source materials may include an ionizable gas or vaporized source material. Energy is applied to the source materials to generate positively charged ions in the plasma chamber 18. The positively charged ions exit the plasma chamber interior through an elliptical arc slit in a cover plate 20 overlying an open side of the plasma chamber 18.

Ions in the plasma chamber 18 are extracted through the arc slit in the plasma chamber cover plate 20 and accelerated toward a mass analyzing magnet 22 by a set of electrodes adjacent the plasma chamber cover plate 20. The mass analyzing magnet 22 is supported within a magnet housing 32. The strength of the magnetic field is controlled by the ion implanter control electronics. The magnet's field is controlled by adjusting a current through the magnet's field windings. The mass analyzing magnet 22 causes the ions traveling along the ion beam 14 to move in a curved trajectory so that only ions having an appropriate atomic mass reach the ion implantation station 16.

Before reaching the implantation chamber the ion beam 14 is further shaped, evaluated and accelerated due to the potential drop from the high voltage of the mass analyzing magnet housing 32 to the grounded implantation chamber. The beamline travel path from the source to the chamber 17 is maintained at a reduced pressure by vacuum pumps P1, P2 spaced along the beam line.

Downstream from the magnet 22 the ion implanter includes a quadrupole assembly 40, a pivoting Faraday cup 42 and an ion beam neutralizer 44. The quadrupole assembly 40 includes a set of magnets oriented around the ion beam 14 which are selectively energized by the control electronics (not shown) to adjust the height of the ion beam 14. The quadrupole assembly 40 is supported within an implanter housing 50. Coupled to an end of the quadrupole assembly 40 facing the magnet 22 is an ion beam shield plate 52. The plate 52 functions in conjunction with the mass analyzing magnet 22 to eliminate undesirable ion species from the ion beam 14.

The Faraday flag 42 is located between the quadrupole assembly 40 and the ion beam neutralization apparatus 44. The Faraday flag is pivotably coupled to the housing 50 so that it can be pivoted into position to intersect the ion beam 14 to measure beam characteristics and, when the measurements are satisfactory, swung out of the beam line so it does not interfere with wafer implantation at the implantation chamber 17.

A prior art ion beam neutralizer 44, commonly referred to as an electron shower, is disclosed in U.S. Pat. No. 5,164,599 to Benveniste, which issued Nov. 17, 1992, and is assigned to the assignee of the present invention. The '599 patent is incorporated herein in its entirety by reference.

Ions extracted from the plasma chamber 18 are positively charged. If the positive charge on the ions is not neutralized prior to implantation of the wafers, the doped wafers will exhibit a net positive charge. As described above and in the '599 patent to Benveniste, such a net positive charge on a wafer has undesirable characteristics.

A prior art ion beam neutralizer is disclosed in copending U.S. patent application Ser. No. 08/519,708 filed Aug. 28, 1995 to Blake. The disclosure of this copending patent application is incorporated by reference.

Figure 2:
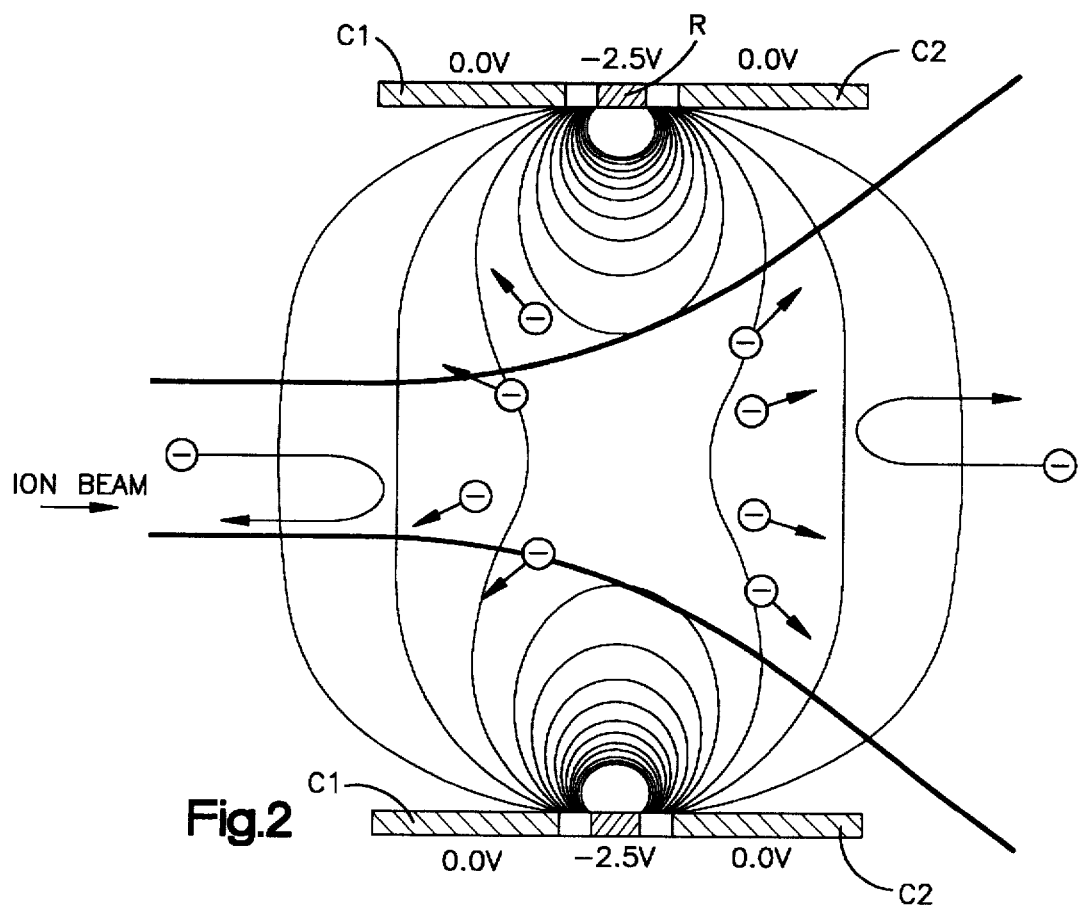
FIG. 2 is an enlarged section view of a region of a prior art suppression electrode positioned upstream from an ion beam neutralizer in an ion implanter.
Figure 3:
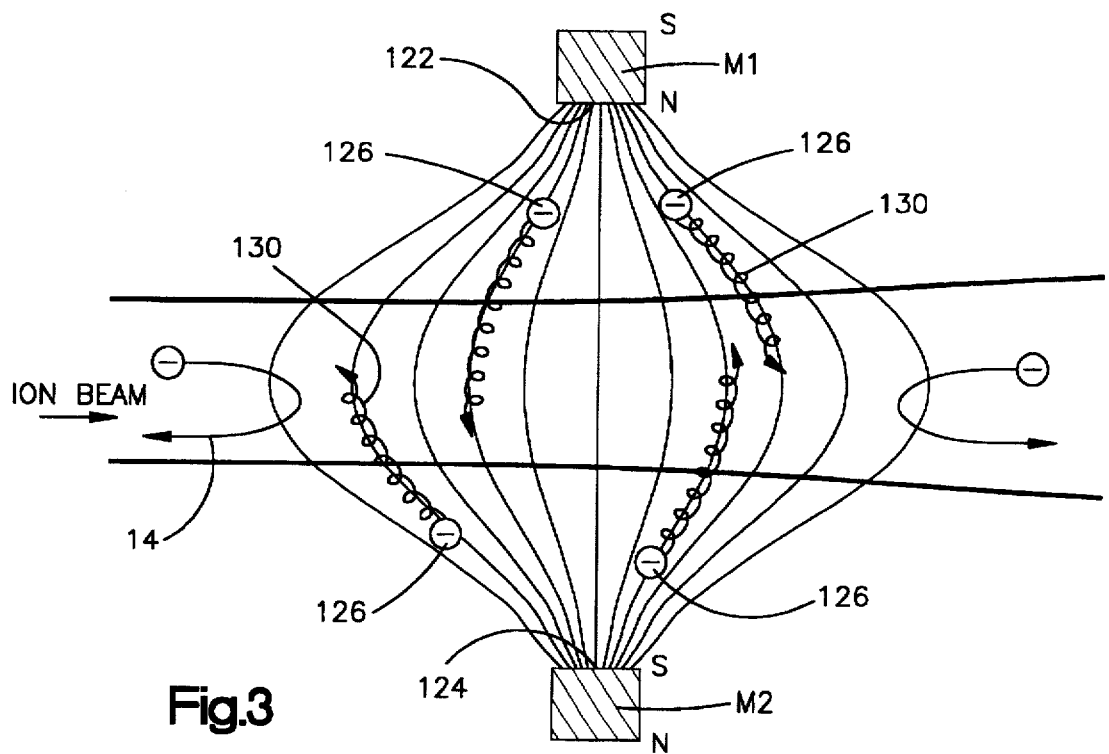
FIG. 3 is an enlarged section view of a region of an ion beam implanter where a magnetic field is set up for inhibiting backstreaming from an ion beam neutralizer.

Directly upstream of the neutralizer 44 is magnetic repeller 110. Components of the repeller 110 are schematically shown in FIG. 3. The repeller 110 includes permanent magnets M1, M2 for inhibiting backstreaming of electrons from the neutralizer. The magnets M1, M2 replace the biased ring aperture R discussed above in relation to FIG. 2.

The neutralizer 44 disclosed in FIG. 1 bounds an open ended, cylindrical interior region large enough to allow the beam to pass unimpeded while neutralizing electrons are injected into the ion beam. The neutralizer 44 and the repeller 110 are shown in FIG. 1 as being formed as an integral unit and are supported by a common base 52 attached to the housing 50.

Rotatably supported within the implantation chamber 17 is a disk shaped wafer support (not shown). Wafers treated by the beam are positioned near a peripheral edge of the wafer support and the support is rotated by a motor (not shown) at a rate of bout 1200 RPM. The ion beam 14 impinges on the wafers and treats the wafers as they rotate in a circular path. Multiple wafers are supported around the edge of the wafer support and are loaded and unloaded through a load lock to allow the beam line to remain evacuated during loading and unloading.

The implantation station 16 is pivotable with respect to the housing 50 and is connected thereto by a flexible bellows 92. The ability to pivot the implantation station 16 permits adjustments to the angle of incidence of the ion beam 14 as the beam impacts wafers within the implantation chamber.

Magnetic repeller 110

FIG. 3 schematically illustrates operation of the magnetic repeller 110. The two permanent magnets M1, M2 are spaced on opposite sides of the ion beam 14. A north pole face 122 of the first magnet M1 faces the ion beam 14 on one side of the beam and a south pole face 124 of the second magnet M2 faces the ion beam on an opposite side of the ion beam. Field lines between the two magnets are illustrated in the FIG. 3 depiction. Electrons moving through the ion beam from locations either upstream or downstream from the magnetic repeller 110 experience a force when they move into the magnetic field between the magnets M1, M2.

An important advantage of the invention is illustrated by the FIG. 3 depiction. Electrons already located between the two magnets M1, M2 are not swept away from their positions within the ion beam. The negatively charged electrons within the magnetic field do not experience a force unless they are moving. If they do experience a force due to random movement within the ion beam they tend to move along spiraling paths 130 back and forth across the ion beam 14. These electrons continue to help neutralize the beam rather than being swept from the beam due to the presence of electric fields set up by a prior art suppression electrode or ring R (FIG. 2).

Figure 4:
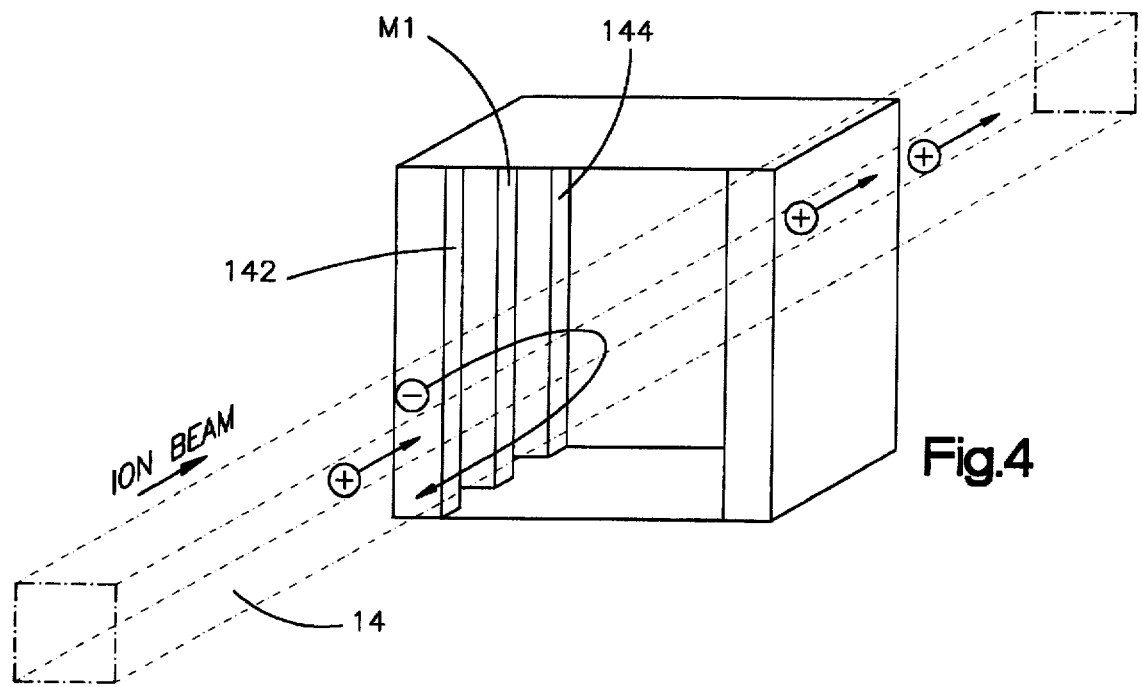
FIG. 4 is a perspective view of a region of an ion beam travel path in the vicinity of a permanent magnet.
Figure 5:
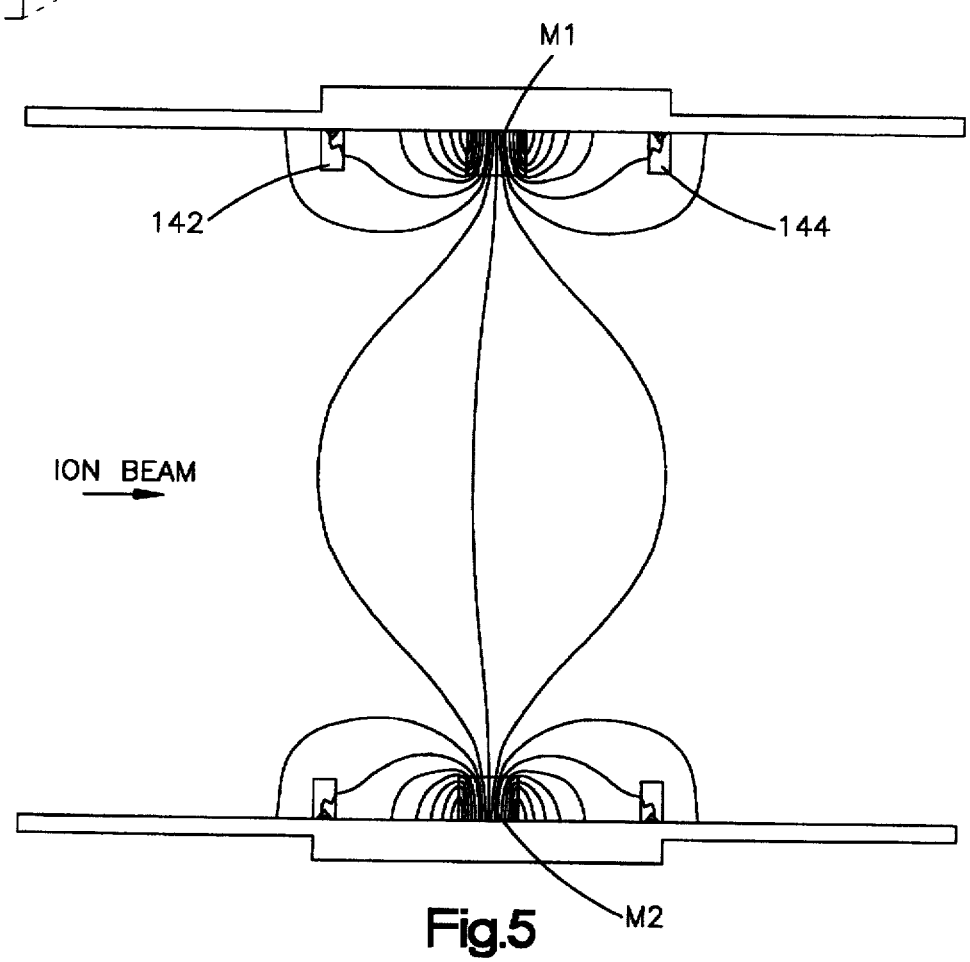
FIG. 5 is an enlarged section view of a region of an ion beam implanter wherein a magnetic field for inhibiting electron backstreaming has magnetic field lines that are concentrated outside of the ion beam travel path.

FIGS. 4 and 5 illustrate an alternate embodiment of a magnetic repeller having field defining structure that bounds the two elongated bar magnets M1, M2. Elongated bars 142, 144 constructed from a ferromagnetic material cause the magnetic field lines to be concentrated on the side of the ion beam 14. The presence of the magnetic bars allows field lines to cross from the south to the north pole but restricts the region in which highly concentrated field lines occur.

Figure 7:
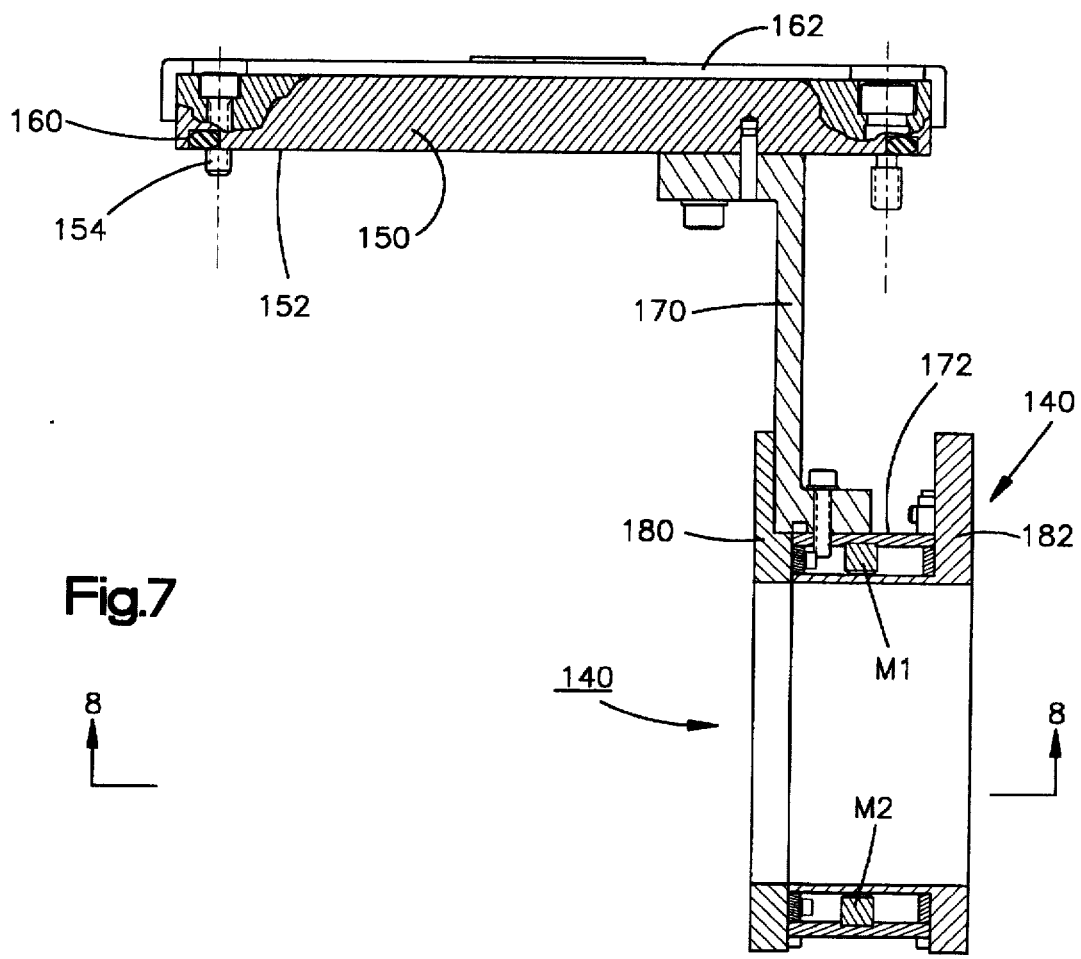
FIG. 7 is a section view of a preferred magnetic electron repeller constructed in accordance with the present invention.
Figure 8:
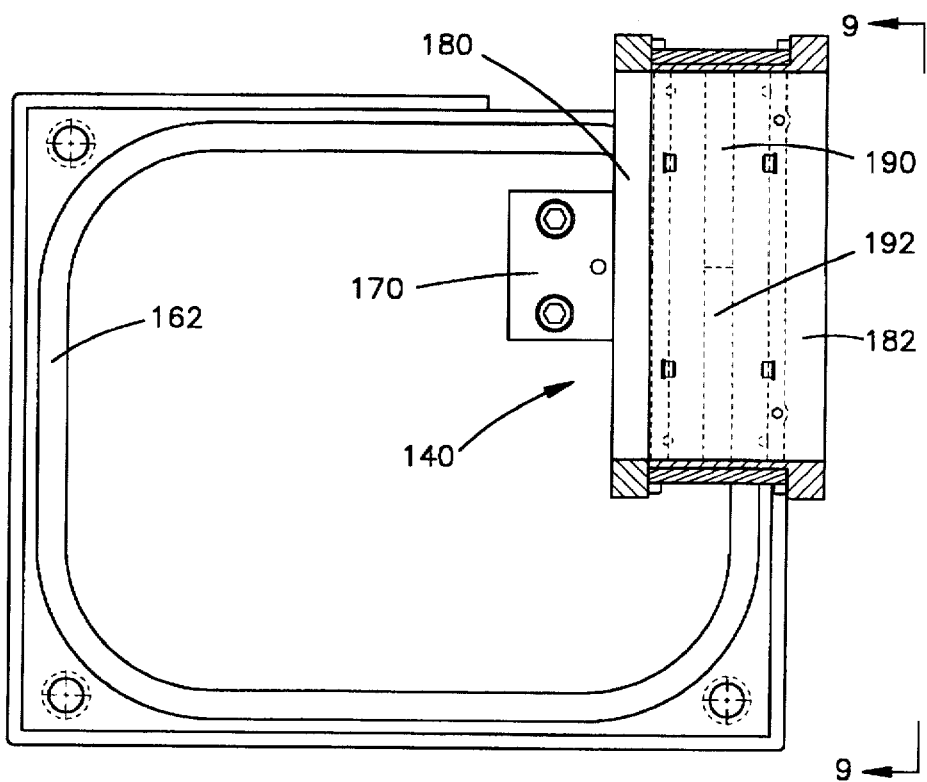
FIG. 8 is a view of the preferred magnetic electron repeller as seen from the plane 8—8 of FIG. 7.
Figure 9:
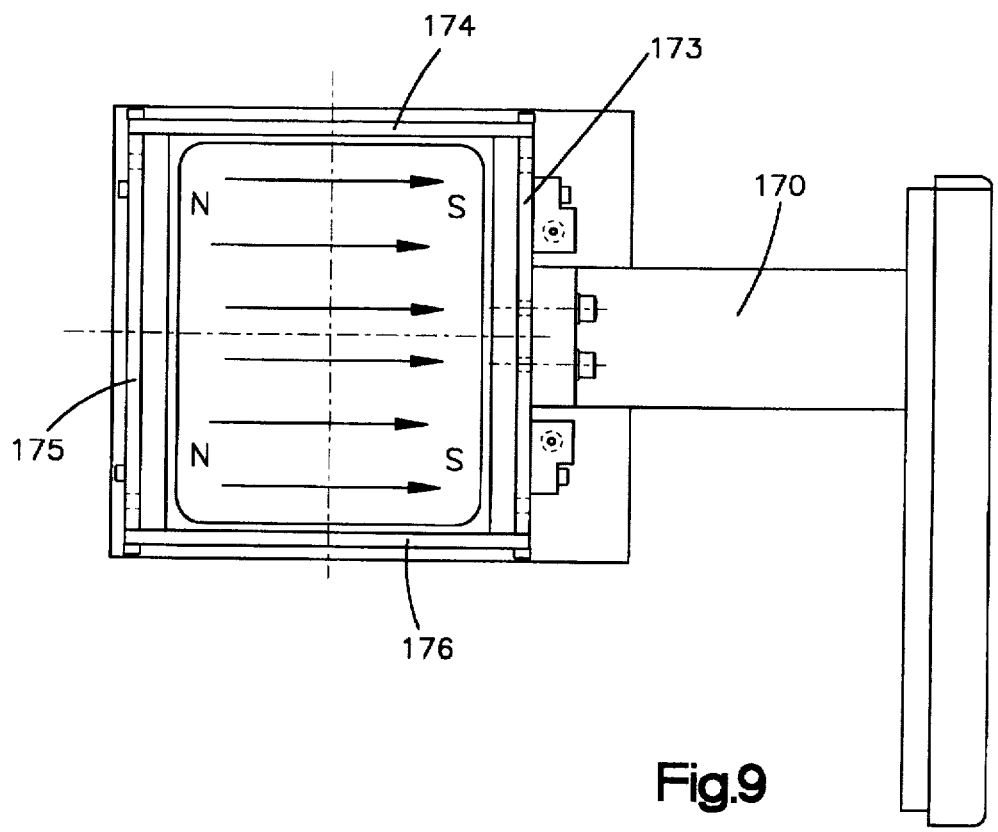
FIG. 9 is a view of the magnetic repeller as seen from the plane 9—9 in FIG. 8.

FIGS. 7–9 illustrate an alternate and presently preferred structure for mounting a repeller 140 that is separate from the neutralizer 44. A metal base 150 supported by the implanter housing 50 includes an inwardly facing surface 152 that abuts the housing 50 around an access opening in the housing 50.

The base 150 is secured to the implanter housing 50 by means of threaded connectors 154 that engage appropriately located openings in the housing 50. An elastomeric gasket 160 fits within a groove 162 (FIG. 8) in the base and seals the implanter interior to allow the implanter 10 to be pumped down to sub-atmospheric pressures. To remove the repeller 140 the connectors 154 are loosened and the base lifted away from the implanter housing 50. A lead shield 162 overlies the base 150 and shields the region of the repeller 140 from ionizing radiations in the region of the implanter.

A bracket 170 attached to the base 150 is connected by a support frame 172. The support frame 172 has four sides and as seen in FIG. 9 is generally rectangular in plan. Four connected side walls 173–176 surround the ion beam 14 and directly support the repeller 140.

The repeller 140 includes two magnets M1, M2 and two graphite shields 180, 182 supported by the frame 172. The graphite shields 180, 182 prevent the ion beam 14 from directly contacting the magnets M1, M2. The magnets M1, M2 set up a generally uniform dipole field in a region between the magnets. The magnetic lines of force set up by this field are illustrated in the FIG. 9 depiction of the repeller 140.

Each magnet such as the magnet M1 in FIG. 7 is made up of two abutting bar magnets 190, 192 which can be seen in the phantom view of FIG. 7. The magnets 190, 192 are aligned end to end with the south pole of one magnet abutting the north pole of the adjacent magnet. The repeller preferably uses four identical magnets constructed from samarium cobalt and having a surface field strength of at least 2500 gauss. In a typical implanter the ion beam is shaped to be about 0.7 inches wide at the location the beam passes through the neutralizer 44. To allow unimpeded passage of the ion beam through the magnetic repeller 140 the two magnets M1, M2 are spaced apart by about 2.8 inches.

Figure 6:
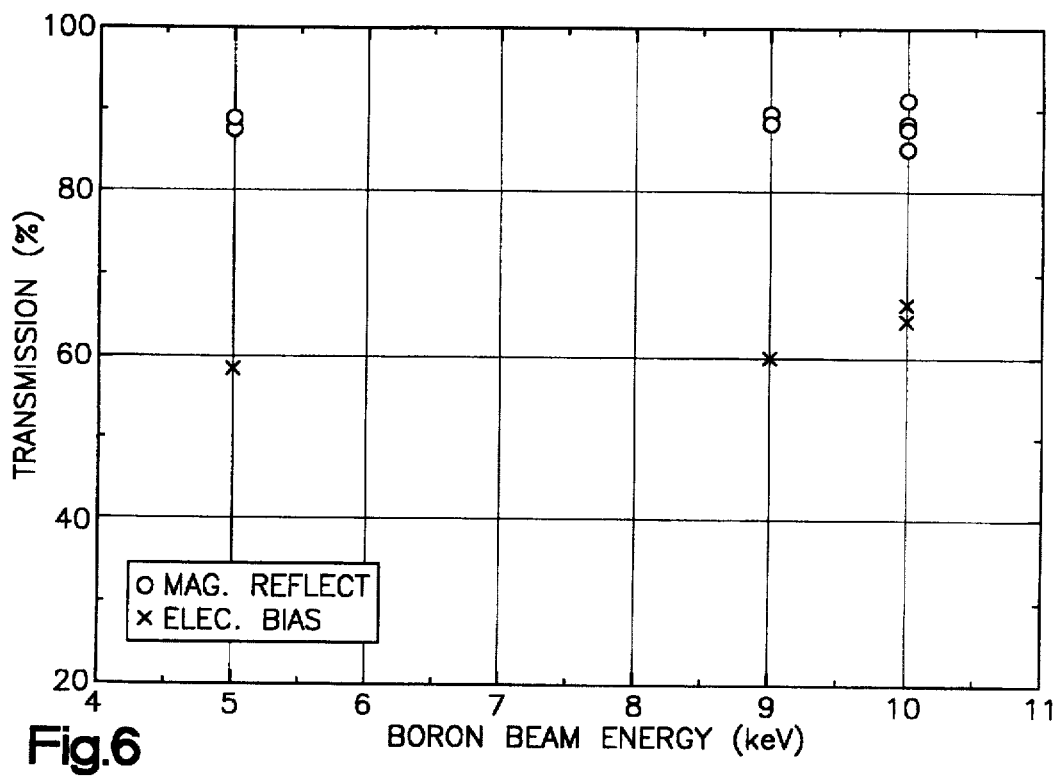
FIG. 6 is a graph of transmission efficiency as a function of ion beam energy for two contrasting electron backstream controls; one of the backstreaming controls is a prior art technique and a second is a technique practiced in accordance with the invention.

FIG. 6 is a graph of ion beam transmission as a percentage of the beam which leaves the mass analysis magnet 22. This efficiency is plotted as a function of beam energy in kev. Two different sets of data are depicted. The data points for a prior art ion implanter that utilizes a suppression electrode or ring R biased at a negative potential are plotted with 'x's on the graph. The data points on the graph designated with 'o's are for an ion implanter having a magnetic repeller such as the repeller 140 shown in FIGS. 7–9. The transmission efficiency is seen to have improved from approximately 60% for the prior art implanter to an efficiency of greater than 80% for the implanter using a magnetic repeller 140.

While the present invention has been described in some degree of particularity, it is to be understood that those of ordinary skill in the art may make certain additions or modifications to, or deletions from, the described present embodiment of the invention without departing from the spirit or scope of the invention, as set forth in the appended claims.

We claim:

1. A method of directing an ion beam from an ion source to a treatment station for ion beam treatment of a work piece by controlling movement of neutralizing electrons within the ion beam; said method comprising the steps of:
   a) directing a beam of ions along a beam travel path from a source to an implantation station where target workpieces are placed for ion beam treatment;
   b) injecting neutralizing electrons into the ion beam at a neutralizing location before the ion beam contacts the target workpieces; and
   c) creating a dipole magnetic field that extends through the ion beam before the ion beam reaches the neutralizing location for impeding movement of electrons in a direction parallel to an ion beam travel path at the region of the dipole magnetic field by positioning first and second magnets having pole pieces of opposite polarity that face each other across the ion beam next to the ion beam at a position before the ions reach the neutralizing location.

2. The method of claim 1 wherein the step of creating the magnetic field is performed by positioning first and second permanent magnets at spaced apart positions on opposite sides of an ion beam travel path.

3. An ion implanter for treating workpieces by ion bombardment of the workpieces at an ion implantation location comprising:
   a) an ion source for emitting ions;
   b) ion beam defining structure for creating an ion beam from ions emitted from the ion source and including structure bounding an evacuated interior region of the ion implanter traversed by the ion beam;
   c) an implantation station for positioning one or more workpieces in a position for beam treatment by the ion beam;
   d) an ion beam neutralizer for injecting neutralizing electrons into a neutralizing region of the ion beam upstream from the implantation station; and
   e) first and second magnets spaced on opposite sides of the ion beam upstream from the ion beam neutralizer having opposite polarity pole pieces facing inwardly toward the ion beam for creating a magnetic field that extends through a region of the ion beam between the first and second magnets for impeding movement of the neutralizing electrons in a direction along an ion beam travel path away from the neutralizing region of the ion beam.

4. The ion implanter of claim 3 wherein the first and second magnets are permanent magnets having inwardly facing pole faces for setting up a dipole field between said pole faces.

5. The ion implanter of claim 4 wherein the first and second permanent magnets are elongated bar magnets.

6. The ion implanter of claim 5 additionally comprising ferromagnetic material positioned next to the elongated bar magnets for causing magnetic field lines to be concentrated along a region occupied by the ion beam.

7. The ion implanter of claim 6 wherein the ferromagnetic material comprises ferromagnetic bars positioned on both sides of each of the bar magnets.

8. The ion implanter of claim 3 additionally comprising first and second ferromagnetic field adjusting members supported in close proximity to the first and second magnets to adjust the magnetic field concentration in a region between the first and second magnets.

9. An ion beam repeller for controlling electron movement in an ion implanter comprising:
   a) first and second elongated permanent magnets oriented with respect to an ion beam travel path to allow ions in an ion beam to pass between said first and second elongated permanent magnets and for creating an electron repelling magnetic field in a magnetic field region between said elongated permanent magnets;
   b) support structure for supporting the first and second elongated permanent magnets on opposite sides of the ion beam with opposite polarity poles of said magnets facing each other to cause a magnetic field to extend across the ion beam in relation to the ion beam to impede the flow of electrons in a direction parallel to an ion beam travel path; and
   c) graphite shield means supported by the support structure for shielding the magnets from direct contact with ions in the ion beam by defining an entrance window through which the ion beam passes to enter the magnetic field region between the elongated permanent magnets.

10. The ion beam repeller of claim 9 wherein the graphite shield means comprises first and second graphite shields connected to the support structure and separate the first and second elongated permanent magnets from the ion beam path.

11. The ion beam repeller of claim 10 additionally comprising ferromagnetic material positioned next to the permanent magnets for causing magnetic field lines to be concentrated along a region occupied by the ion beam.

12. An ion beam repeller for controlling electron movement in an ion implanter comprising:
   a) first and second elongated permanent magnets oriented with respect to an ion beam travel path to allow ions in an ion beam to pass between said first and second elongated permanent magnets and for creating an electron repelling magnetic field in a magnetic field region between said elongated permanent magnets;
   b) ferromagnetic material positioned next to the first and second elongated permanent magnets for causing magnetic field lines to be concentrated outside a region occupied by the ion beam;
   c) graphite shield means for shielding the first and second magnets from direct contact with ions in the ion beam by defining an entrance window through which the ion beam passes to enter the magnetic field region between the first and second magnets; and
   d) support structure for supporting the first and second elongated permanent magnets, the ferromagnetic material and the graphite shield means in relation to the ion beam to impede the flow of electrons along the ion beam.

13. An ion implanter for treating workpieces by ion bombardment of the workpieces at an ion implantation location comprising:
   a) an ion source for emitting ions;
   b) ion beam defining structure for creating an ion beam from ions emitted from the ion source and including structure bounding an evacuated interior region of the ion implanter traversed by the ion beam;
   c) an implantation station for positioning one or more workpieces in a position for beam treatment by the ion beam;
   d) an ion beam neutralizer for injecting neutralizing electrons into a neutralizing region of the ion beam upstream from the implantation station; and
   e) first and second magnets spaced on opposite sides of the ion beam positioned upstream from the ion beam neutralizer for impeding movement of the neutralizing electrons away from the neutralizing region of the ion beam by setting up a magnetic field between the first and second magnets that intersects the ion beam at a region upstream from the ion beam neutralizer; and
   f) first and second ferromagnetic field adjusting members supported in close proximity to the first and second magnets to adjust a magnetic field concentration in a region between the first and second magnets.

14. An ion beam repeller for controlling electron movement in an ion implanter comprising:
   a) first and second elongated permanent magnets oriented with respect to an ion beam travel path to allow ions in an ion beam to pass between said first and second elongated permanent magnets and for creating an electron repelling magnetic field in a magnetic field region between said elongated permanent magnets;
   b) support structure for supporting the first and second elongated permanent magnets in relation to the ion beam to impede the flow of electrons along the ion beam;
   c) first and second graphite shields connected to the support structure for separating the first and second elongated permanent magnets from the ion beam path and thereby shielding the magnets from direct contact with ions in the ion beam by defining an entrance window through which the ion beam passes to enter the magnetic field region between the elongated permanent magnets; and
   d) ferromagnetic material positioned next to the permanent magnets for causing magnetic field lines to be concentrated along a region occupied by the ion beam.

15. The ion beam repeller of claim 14 wherein the ferromagnetic material positioned next to the magnets comprises ferromagnetic bars positioned on both sides of each of the bar magnets.

* * * * *